(12) United States Patent  
Dalmia et al.

(10) Patent No.: US 6,366,135 B1  
(45) Date of Patent: Apr. 2, 2002

(54) DATA FREQUENCY DETECTOR

(75) Inventors: Kamal Dalmia, Austin, TX (US); Anil Agarwal, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/471,915

(22) Filed: Dec. 23, 1999

(51) Int. Cl.$^7$ .......................... G01R 25/00; H03D 13/00
(52) U.S. Cl. .......................................... 327/12; 327/159
(58) Field of Search ................................ 327/2, 3, 7, 8, 327/12, 39, 42, 43, 49, 148, 150, 157, 159

(56) References Cited

U.S. PATENT DOCUMENTS

| | | | |
|---|---|---|---|
| 4,593,254 A | 6/1986 | Coburn ........................ 331/1 A |
| 4,594,564 A | * 6/1986 | Yarborough, Jr. ............ 331/1 A |
| 4,940,952 A | 7/1990 | Kegasa ......................... 331/11 |
| 4,943,788 A | 7/1990 | Laws et al. ..................... 331/11 |
| 5,506,875 A | 4/1996 | Nuckolls et al. ............. 375/375 |
| 5,574,756 A | * 11/1996 | Jeong .......................... 375/376 |
| 5,694,088 A | 12/1997 | Dickson ....................... 331/12 |
| 5,712,580 A | * 1/1998 | Raumgartner et al. ........ 327/12 |
| 5,739,709 A | 4/1998 | Banno ......................... 327/156 |
| 5,799,048 A | * 8/1998 | Farjad-Rad et al. ........ 375/360 |
| 5,950,115 A | 9/1999 | Momtaz et al. ............... 455/73 |
| 5,953,386 A | * 9/1999 | Anderson .................... 375/376 |
| 6,041,090 A | * 3/2000 | Chen .......................... 375/376 |
| 6,055,286 A | * 4/2000 | Wu et al. .................... 375/375 |
| 6,075,416 A | 6/2000 | Dalmia ........................ 331/25 |
| 6,081,572 A | 6/2000 | Filip .......................... 375/376 |

OTHER PUBLICATIONS

Robin et al., A 3.3 V 600MHZ—1.30 GHZ CMOS Phase–Locked Loop for Clock Synchronization of Optical Chip–to–Chip Interconnects, Mar. 1998, IEEE, pp. 429–432.*

A 1Gb/s CMOS Clock and Data Recovery Circuit, by Hui Wang and Richard Nottenburg, 1999 IEEE International Solid–State Circuits Conference, Feb. 17, 1999, pp. 354–355.

Kamal Dalmia et al., Reference–Free Clock Generator and Data Recovery PLL, Serial No. 09/471,914, Filed Dec. 23, 1999.

Kamal Dalmia, Digital Phase/Frequency Detector, and Clock Generator and Data Recovery PLL Containing the Same, Ser. No. 09/470,665, Filed Dec. 23, 1999.

Kamal Dalmia, Reference–Free Clock Generator and Data Recovery PLL, Ser. No. 09/471,576, filed Dec. 23, 1999.

* cited by examiner

Primary Examiner—Terry D. Cunningham
Assistant Examiner—Quan Tra
(74) Attorney, Agent, or Firm—Christopher P. Maiorana, P.C.

(57) ABSTRACT

A circuit comprising a first circuit and a state machine. The first circuit may be configured to generate a plurality of state inputs in response to (i) a first clock signal, (ii) a second clock signal delayed from the first clock signal, and (iii) a data signal. The state machine may be configured to generate a pump up signal and a pump down signal in response to (i) said data signal and (ii) a plurality of quadrants defined by a number of possible combinations of the state inputs. The state machine may be further configured to transition between any of the quadrants.

16 Claims, 4 Drawing Sheets

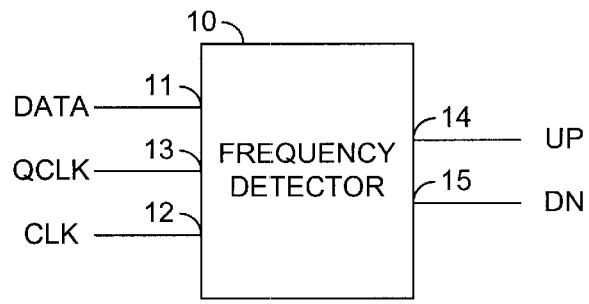
FIG. 1
(CONVENTIONAL)
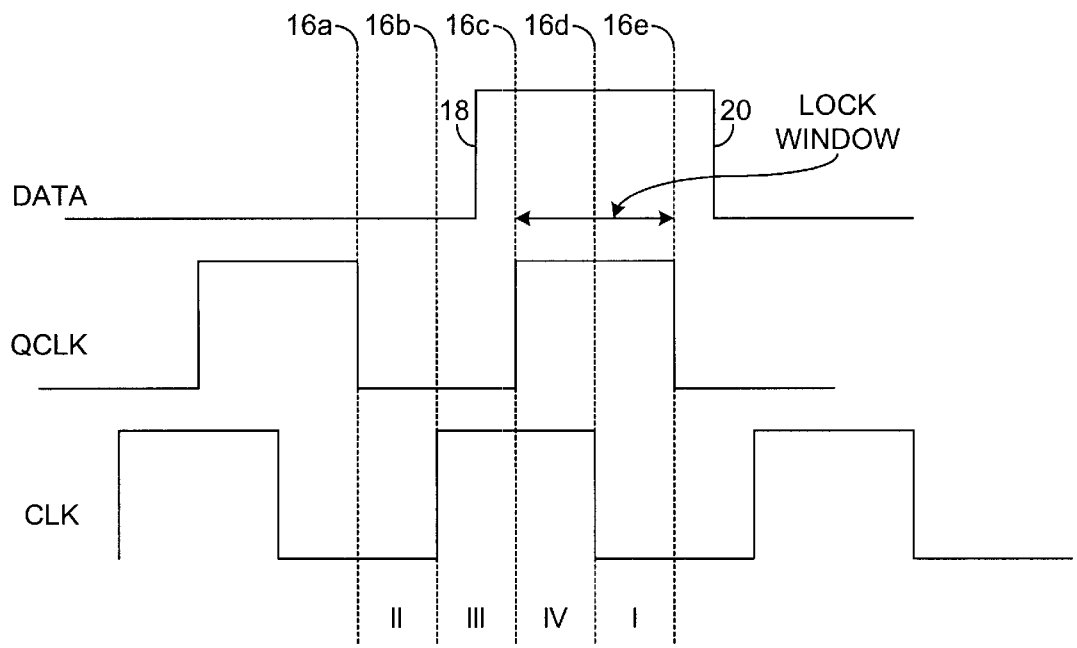
FIG. 2
(CONVENTIONAL)

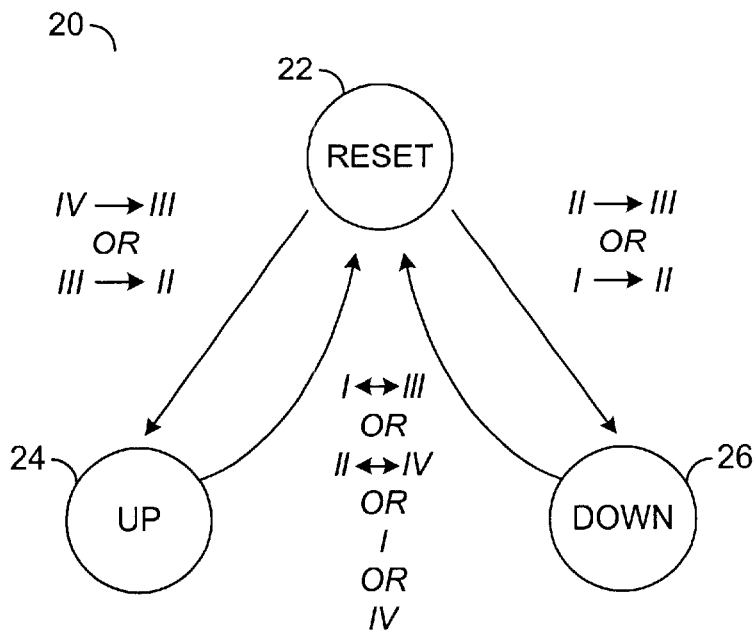
FIG. 3
(CONVENTIONAL)

DATA FREQUENCY DETECTOR

CROSS REFERENCE TO RELATED APPLICATIONS

The present application may relate to co-pending application Ser. No. 09/171,914, Ser. No. 09/470,668 and Ser. No. 09/471,576, filed concurrently and each hereby incorporated by reference in their entirety.

FIELD OF THE INVENTION

The present invention relates to an architecture and/or method for implementing a frequency detector generally and, more particularly, to a method and/or architecture for implementing a data frequency detector.

BACKGROUND OF THE INVENTION

Frequency detectors are used in analog phase-locked loops for data recovery, clock recovery and frequency synthesis applications. One conventional approach for implementing a frequency detector may be found in an ISSCC99 article entitled "A 1 Gb/s CMOS Clock and Data Recovery Circuit" by Hui Wang, Richard Nottenburg which is hereby incorporated by reference in its entirety.

FIG. 1 illustrates an example of a conventional frequency detector 10. The frequency detector 10 has an input 11 that receives a signal DATA, an input 12 that receives a clock signal CLK and an input 13 that receives a signal QCLK. The frequency detector 10 has an output 14 that presents a signal UP and an output 15 that presents a signal DN. FIG. 2 illustrates a timing diagram of the conventional frequency detector of FIG. 1 illustrating a signal DATA, a signal CLK and a signal QCLK. A number of quadrants I, II, III and IV are defined between a number of vertical lines 16a–16e. For example, quadrant I is defined as the time between the vertical line 16b and 16c. Quadrants II, III and IV are similarly defined. A lock window is defined as a time between the vertical line 16c and the vertical line 16e.

The quadrants are defined such that, during a particular quadrant, the signal CLK is generally at either a logic high or a logic low and the signal QCLK is at either a logic high or a logic low. Therefore, the vertical lines 16a–16e generally occur at the transitions of the signals CLK and QCLK.

In general, the signal QCLK is 90 degrees out of phase with the signal CLK. The four quadrants generally represent the various combinations of a digital high (e.g., a "1") and a digital low (e.g., a "0") of the signal CLK and the signal QCLK. For example, in the quadrant I, the signal CLK is low and the signal QCLK is high. In the quadrant II, the signal CLK is low and the signal QCLK is low. In the quadrant III, the signal QCLK is low and the signal CLK is high. In the quadrant IV, the signal QCLK is high and the signal CLK is high. The particular polarities of the high and low signals can be inverted. However, with the two signals CLK and QCLK operating at 90 degrees out of phase, only four possible combinations can be implemented. The four illustrated quadrants represent the four various combinations of the signal CLK and the signal QCLK. The signal DATA is shown having a transition 18 and a transition 20. The transition 18 generally occurs in one of the four quadrants (shown in the quadrant III in FIG. 2, where the signal CLK is high and the signal QCLK is low). When the data transition 18 occurs in the quadrant I or the quadrant IV, a lock condition may be present.

Referring to FIG. 3, a state machine 20 is shown implementing the various transitions of the timing diagram of FIG. 1. The state machine 20 comprises a "reset" state 22, an "up" state 24 and a "down" state 26. The state machine 20 transitions between the reset state 22 and the down state 26 during (i) a transition between quadrant II and quadrant III or (ii) a transition between quadrant I and quadrant II. The reset state 22 transitions to the up state 24 during (i) the transition between quadrant IV and quadrant III or (ii) a transition between quadrant III and quadrant II. The states 24 and 26 transition back to the reset state 22 during (i) a transition between quadrant I and III (or vice versa), (ii) a transition between quadrant II and IV (or vice versa), (iii) quadrant I or (iv) quadrant IV. The state machine 20 requires the state 24 and the state 26 to transition back to the reset state 22 after each transition.

The state machine 20 transitions to a next state 24 or 26 in response to present transitions between quadrants. The state machine 20 does not use information available in the form of a current state during a transition between two quadrants. Furthermore, the state machine 20 does not check transitions between quadrants II and III due to jitter. The state machine 20 can only transition between the states 22 and 24 or the states 22 and 26.

Conventional frequency detectors implemented with the state machine 20 have a number of drawbacks including (i) leaving unused states, (ii) having next state logic that only depends on a present transition, (iii) a failure to use information available in the form of a current state and/or (iv) a failure to check transitions between particular quadrants (e.g., II and III) due to jitter.

SUMMARY OF THE INVENTION

The present invention concerns a circuit comprising a first circuit and a state machine. The first circuit may be configured to generate a plurality of state inputs in response to (i) a first clock signal, (ii) a second clock signal delayed from the first clock signal, and (iii) a data signal. The state machine may be configured to generate a pump up signal and a pump down signal in response to (i) said data signal and (ii) a plurality of quadrants defined by a number of possible combinations of the state inputs. The state machine may be further configured to transition between any of the quadrants.

The objects, features and advantages of the present invention include providing a method and/or architecture to implement a frequency detector that may (i) improve the gain of the frequency detection, (ii) decrease PLL lock time and/or (iii) increase jitter tolerance.

BRIEF DESCRIPTION OF THE DRAWINGS

These and other objects, features and advantages of the present invention will be apparent from the following detailed description and the appended claims and drawings in which:

FIG. 1 is a block diagram of a conventional frequency detector;

FIG. 2 is a timing diagram of a data and clock signal;

FIG. 3 is a conventional state machine illustrating the operation of the circuit of FIG. 1;

DETAILED DESCRIPTION OF THE PREFERRED EMBODIMENT

Figure 4:
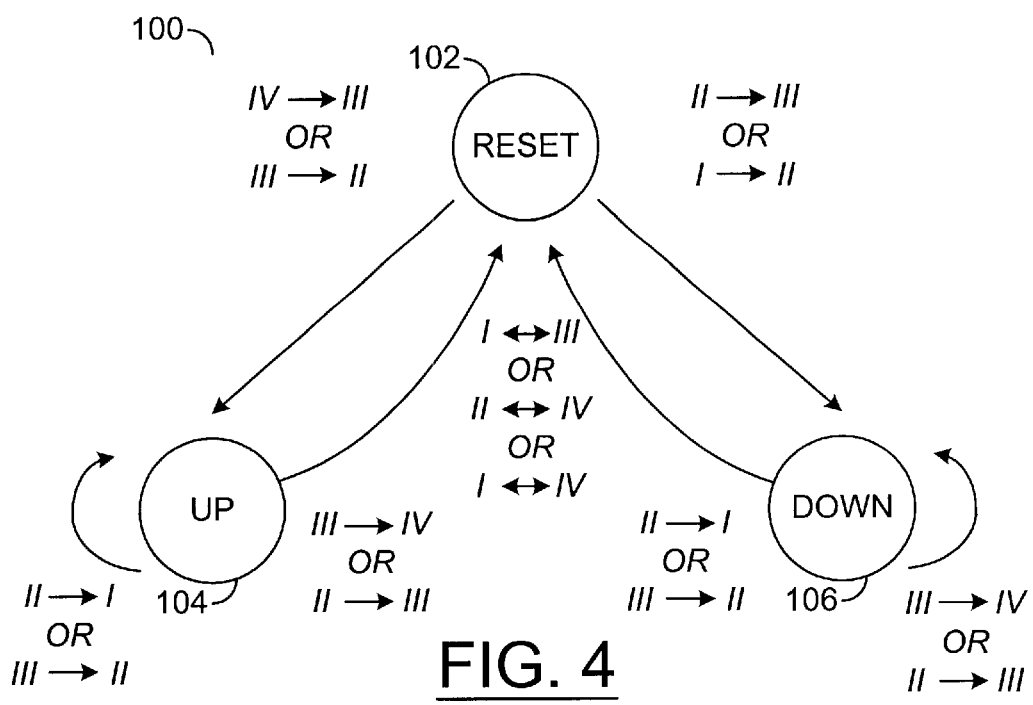
FIG. 4 is a state diagram illustrating the operation of a preferred embodiment of the present invention.

Referring to FIG. 4, a state diagram (or state machine) 100 is shown in accordance with a preferred embodiment of the present invention. The state diagram 100 generally comprises a "reset" state 102, an "up" state 104 and a "down" state 106. The state diagram 100 may be similar to the state diagram 20 of FIG. 3. However, the state diagram 100, may have alternate transitions compared to the state machine 20. For example, the state machine 100 may remain in the state 104 during a transition between the quadrants II and I or the quadrants III and II. Additionally, the state machine may remain in the state 106 during a transition between the states III and IV or II and III. Additionally, the state machine 100 may respond to a previous state as well as a current transition. For example, a transition between the quadrant III to the quadrant II may (i) cause a transition to the up state 104 if the state machine is in the reset state 102, (ii) remain in the up state 104 if the state machine 100 is in the up state 104 or (iii) cause a transition to the reset state 102 if the state machine 100 is in the down state 106. Other transitions have similar multiple responses.

The state machine 100 may exit the reset state 102 and enter the down state 106 during (i) a transition between quadrant II and quadrant III or (ii) a transition between quadrant I and quadrant II. The state machine 100 may remain in the down state 106 during (i) a transition between quadrant III and quadrant IV or (ii) a transition between quadrant II and quadrant III. The state machine 100 may exit the down state 106 and enter the reset state 102 during (i) a transition between quadrant II and quadrant I or (ii) a transition between quadrant III and quadrant II.

The state machine 100 may exit the reset state 102 and enter the up state 104 during (i) a transition between quadrant IV and quadrant III or (ii) a transition between quadrant III and quadrant II. The state machine 100 generally remains in the up state 104 during (i) a transition between quadrant II and quadrant I or (ii) a transition between quadrant III and quadrant II. The state machine 100 may exit the up state 104 and enter the reset state 102 during (i) a transition between quadrant III and quadrant IV or (ii) a transition between quadrant II and quadrant III.

The state machine generally exits either the state 104 or the state 106 and enters the reset state 102 during (i) a transition between quadrants I and III, (ii) a transition between the quadrants II and IV, and/or (iii) a transition between the quadrants I and IV. As illustrated, the next state of the state machine 100 generally depends upon the previous state for each transition between two consecutive quadrants. The state machine 100 may generate every valid up and down transition signal. The state machine 100 may be used to improve lock time when implemented in a frequency detector. A transition of the signal DATA may (i) sample the signal CLK and QCLK (ii) respond with the appropriate action (e.g., either a transition to a new state or remain in the current state). The state machine 100 may provide an improvement in jitter tolerance by allowing transitions between quadrants II and III, which is not present in the state machine 20.

The present invention may be used in clock and data recovery PLL designs that may operate at Gigabit/sec (and higher) data rates. The present invention may enable (i) the implementation of a clock recovery PLL with no reference clock and (ii) an improved lock time.

Figure 5:
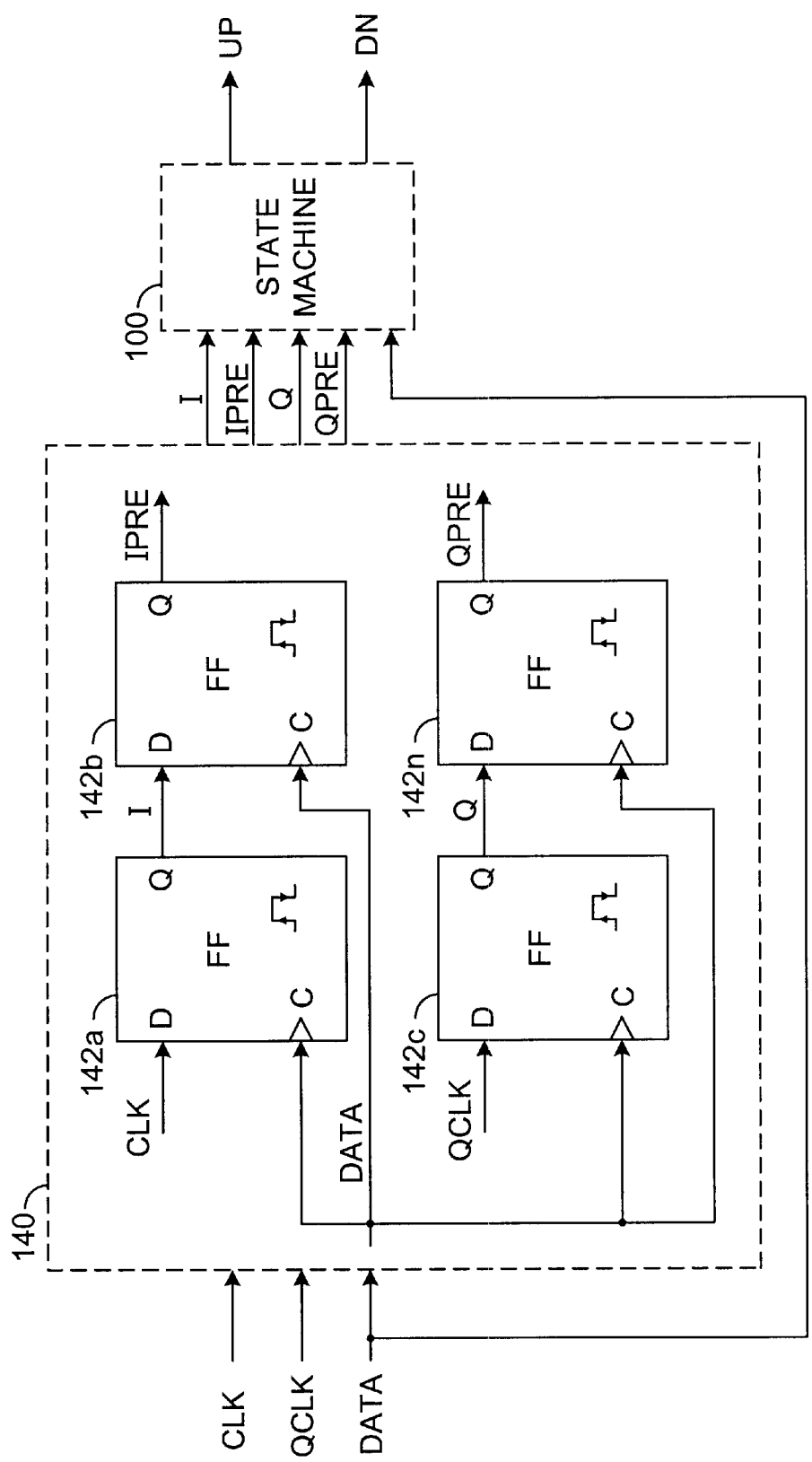
FIG. 5 is an exemplary implementation of the state machine of FIG. 4.

Referring to FIG. 5, an exemplary implementation of the state machine 100 is shown in the context of a circuit 140. The circuit 140 may generate a number of state inputs (e.g., I, Ipre, Q and Qpre) presented to the state machine 100. The generation of the state inputs will be described in more detail in connection with FIG. 6. The circuit 140 may comprise a number of flip-flops 142a–142n. The flip-flops may be implemented in one example, as double-edge triggered flip-flops. The input signal DATA may be presented to the clock input of each of the flip-flops 142a–142n. The clock signal CLK may be presented to the D input of the flip-flop 142a. The flip-flop 142a may present the signal I to the D input of the flip-flop 142b. The flip-flop 142b may present the signal Ipre. The flip-flop 142c may receive the clock signal QCLK at a D input. The flip-flop 142c may present the signal Q to a D input of the flip-flop 142n. The flip-flop 142n may present the signal Qpre.

In general, the circuit 140 presents the signal I, the signal Ipre, the signal Q and the signal Qpre to the state machine 100 in response to the signal CLK, the signal QCLK and the signal DATA. The signal QCLK may be, in one example, delayed 90 degrees with respect to the signal CLK. Additionally, the state machine 100 may receive the signal DATA. The state machine 100 generally presents a signal (e.g., UP) and a signal (e.g., DN) in response to the state inputs I, Ipre, Q, Qpre and DATA.

Figure 6:
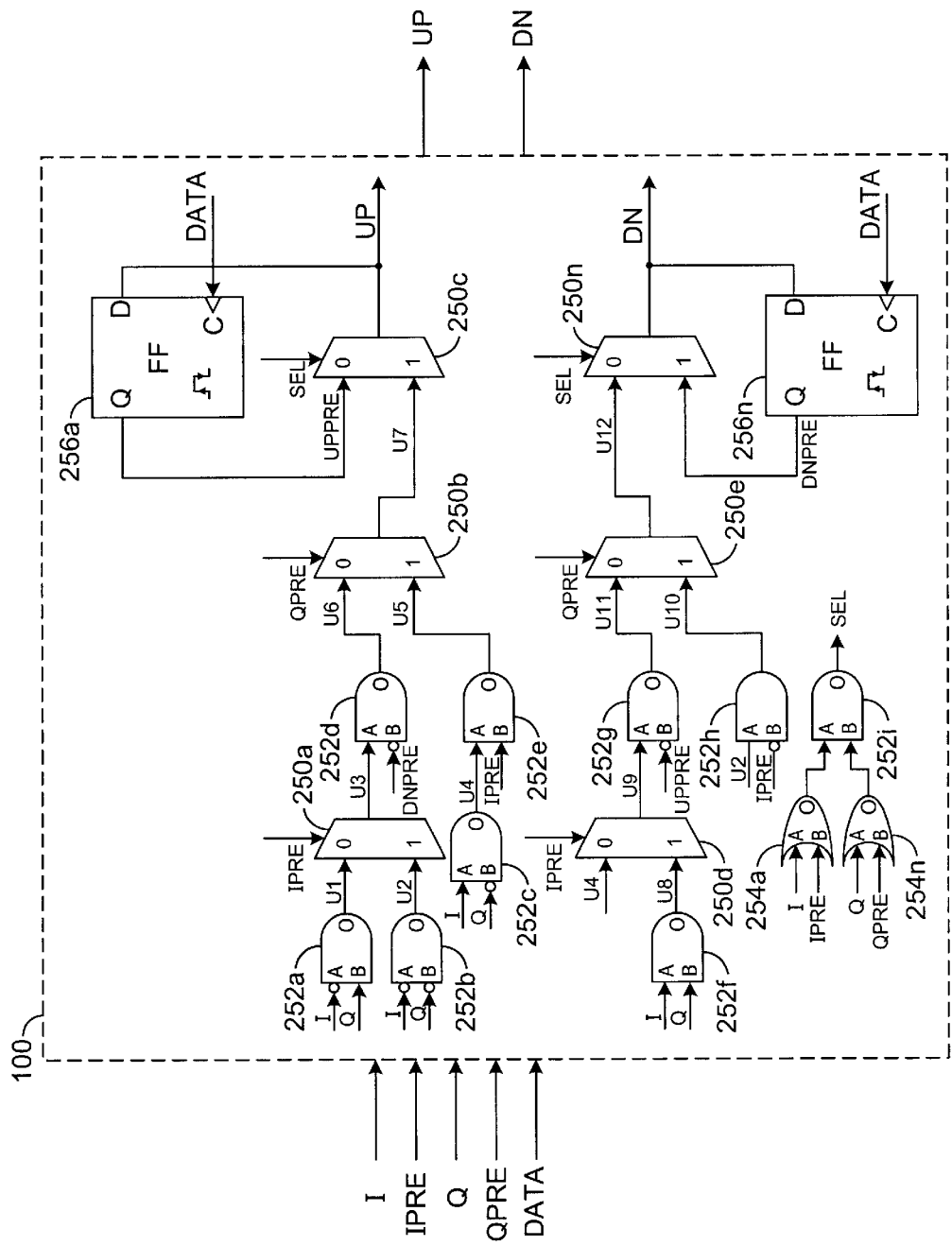
FIG. 6 is an exemplary logic circuit implementing the state machine of FIG. 5.

Referring to FIG. 6, an exemplary logic circuit implementing the state machine 100 is shown. The state machine 100 generally comprises a number of multiplexers 250a–250n, a number of gates 252a–252n, a number of gates 254a–254n and a number of flip-flops 256a–256n. In one example, the gates 252a–242n may be exclusive OR gates. However, other gates may be implemented accordingly to meet the design criteria of a particular implementation. The gates 252a, 252b, 252c and 252f generally receive the signal I and the signal Q. The multiplexers 250a and 250c generally receive inputs from one or more of the gates 252a–252n and may have a select input that may receive the signal Ipre. The multiplexers 250b and 250d generally receive inputs from one or more of the gates 252a–252n and may receive the signal Qpre as the select input.

The gate 252i may present a signal (e.g., SEL). The multiplexer 250c generally presents the signal UP. The multiplexer 250c generally receives an output (e.g., U7) from the multiplexer 250b and a latched feedback of the signal UP (e.g., UPPRE). The flip-flop 256a generally latches the signal UP in response to the signal DATA as the clock. Similarly, the multiplexer 250n may present the signal DN in response to a signal from the multiplexer 250d (e.g., U12) and a latched feedback of the signal DN (e.g., DNPRE). The flip-flop 256n may latch the signal DN in response to the signal DATA. The multiplexers 250c and 250n generally respond to a signal SEL at the select input. The flip-flops 256a–256n may be implemented, in one example, as double edge triggered flip-flops.

The signals UP and DN may be used as pump up and/or pump down signals that may be presented to a voltage controlled oscillator of a phase-locked loop circuit. By providing more flexibility between transitions, the present invention may improve the performance of such a phase-locked loop by implementing a frequency detector with a low lock time, increased jitter tolerance and a decreased lock time, when compared with conventional approaches.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a first circuit configured to generate a plurality of state inputs in response to (i) a first clock signal, (ii) a second clock signal delayed from said first clock signal, and (iii) a data signal;

a state machine configured to generate a pump up signal and a pump down signal in response to (i) said data signal and (ii) signals in a plurality of quadrants defined by a number of possible combinations of said state inputs, wherein said state machine is further configured to transition between any of the quadrants by transitioning to a next state in response to one or more previous states.

2. The circuit according to claim 1, wherein said second clock signal is delayed 90 degrees with respect to said first clock signal.

3. The circuit according to claim 1, wherein said state machine is further configured to transition to a next state in response to one or more previous states.

4. The circuit according to claim 3, wherein said one or more previous states comprise transitions between consecutive quadrants.

5. The circuit according to claim 1, wherein said state machine is further configured to check between a pair of quadrants of said plurality of quadrants.

6. The circuit according to claim 5, wherein said pair of quadrants comprise consecutive quadrants.

7. The circuit according to claim 5, wherein said state machine is further configured to check between said pair of quadrants to reduce jitter.

8. The circuit according to claim 7, wherein said state machine is further configured to determine if a next state depends on a previous state.

9. A circuit comprising:
   means for generating a plurality of state inputs in response to (i) a first clock signal, (ii) a second clock signal delayed from said first clock signal, and (iii) a data signal;
   means for generating a pump up signal and a pump down signal in response to (i) said data signal and (ii) signals in a plurality of quadrants defined by a number of possible combinations of said state inputs, wherein said state machine is further configured to transition between any of the quadrants by transitioning to a next state in response to one or more previous states.

10. A method configured to detect one or more frequencies comprising the steps of:
   (A) generating a plurality of state inputs in response to (i) a first clock signal, (ii) a second clock signal delayed from said first clock signal, and (iii) a data signal;
   (B) generating a pump up signal and a pump down signal in response to (i) said data signal and (ii) signals in a plurality of quadrants defined by a number of possible combinations of said state inputs, wherein said state machine is further configured to transition between any of the quadrants by transitioning to a next state in response to one or more previous states.

11. The method according to claim 10, wherein said one or more previous states comprise transitions between consecutive quadrants.

12. The method according to claim 10, further comprising the following step:
   (C) repeating said step (A) between a pair of quadrants of said plurality of quadrants.

13. The method according to claim 12, wherein said pair of quadrants comprise consecutive quadrants.

14. The method according to claim 12, wherein step (C) further comprises checking said step (A) to reduce jitter.

15. The method according to claim 14, wherein step (C) further comprises determining if a next state depends on a previous state.

16. A circuit comprising:
   a first circuit configured to generate a plurality of state inputs in response to (i) a first clock signal, (ii) a second clock signal delayed from said first clock signal, and (iii) a data signal;
   a state machine configured to generate a pump up signal and a pump down signal in response to (i) said data signal and (ii) signals in a plurality of quadrants defined by a number of possible combinations of said state inputs, wherein said state machine is further configured to transition between any of the quadrants and check between a pair of quadrants of said plurality of quadrants by transitioning to a next state in response to one or more previous states.

* * * * *